United States Patent
Wu et al.

(10) Patent No.: US 10,522,391 B2
(45) Date of Patent: Dec. 31, 2019

(54) METHOD AND APPARATUS FOR BACK END OF LINE SEMICONDUCTOR DEVICE PROCESSING

(71) Applicant: Taiwan Semiconductor Manufacturing Company, Ltd., Hsinchu (TW)

(72) Inventors: Chung-Wen Wu, Zhubei (TW); Chih-Yuan Ting, Taipei (TW); Jyu-Horng Shieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/489,511

(22) Filed: Apr. 17, 2017

(65) Prior Publication Data

US 2017/0221816 A1    Aug. 3, 2017

Related U.S. Application Data

(62) Division of application No. 13/891,578, filed on May 10, 2013, now Pat. No. 9,627,250.

(Continued)

(51) Int. Cl.
*H01L 21/768* (2006.01)
*H01L 23/532* (2006.01)
(Continued)

(52) U.S. Cl.
CPC ...... *H01L 21/76802* (2013.01); *H01L 21/762* (2013.01); *H01L 21/76804* (2013.01);
(Continued)

(58) Field of Classification Search
CPC ............ H01L 23/5226; H01L 23/481; H01L 21/76834; H01L 21/76805; H01L 51/0017;
(Continued)

(56) References Cited

U.S. PATENT DOCUMENTS

2009/0224405 A1    9/2009    Chiou et al.
2012/0104622 A1    5/2012    Kim et al.
(Continued)

FOREIGN PATENT DOCUMENTS

KR    100827498 B1 *   5/2008

OTHER PUBLICATIONS

F. B. Kaufman, D. B. Thompson, R. E. Broadie, M. A. Jaso, W. L. Guthrie, D. J. Pearson, M. B. Small Chemical-Mechanical Polishing for Fabricating Patterned W Metal Features as Chip Interconnects, J. Electrochem. Soc., vol. 138, No. 11, p. 3460-3464, Nov. 1991.*
(Continued)

*Primary Examiner* — Nelson Garces
(74) *Attorney, Agent, or Firm* — Slater Matsil, LLP

(57) ABSTRACT

A via opening including an etch stop layer (ESL) opening and methods of forming the same are provided which can be used in the back end of line (BEOL) process of IC fabrication. A metal feature is provided with a first part within a dielectric layer and with a top surface. An ESL is formed with a bottom surface of the ESL above and in contact with the dielectric layer, and a top surface of the ESL above the bottom surface of the ESL. An opening at the ESL is formed exposing the top surface of the metal feature; wherein the opening at the ESL has a bottom edge of the opening above the bottom surface of the ESL, a first sidewall of the opening at a first side of the metal feature, and a second sidewall of the opening at a second side of the metal feature.

20 Claims, 8 Drawing Sheets

Related U.S. Application Data

(60) Provisional application No. 61/777,219, filed on Mar. 12, 2013.

(51) Int. Cl.
  *H01L 23/522* (2006.01)
  *H01L 21/762* (2006.01)
  *H01L 23/48* (2006.01)
  *H01L 51/00* (2006.01)

(52) U.S. Cl.
  CPC .. *H01L 21/76805* (2013.01); *H01L 21/76829* (2013.01); *H01L 21/76832* (2013.01); *H01L 21/76834* (2013.01); *H01L 23/481* (2013.01); *H01L 23/5226* (2013.01); *H01L 23/53295* (2013.01); *H01L 51/0017* (2013.01); *H01L 21/76885* (2013.01); *H01L 2924/0002* (2013.01)

(58) Field of Classification Search
  CPC ............. H01L 21/76829; H01L 21/762; H01L 21/76804
  USPC .................................................. 257/770–780
  See application file for complete search history.

(56) References Cited

U.S. PATENT DOCUMENTS

| | | | |
|---|---|---|---|
| 2013/0082393 A1* | 4/2013 | Kawamura | H01L 21/76802 257/773 |
| 2013/0127584 A1* | 5/2013 | Filippi | G11C 29/702 337/297 |
| 2014/0027925 A1* | 1/2014 | Tseng | H01L 23/481 257/774 |
| 2014/0035109 A1* | 2/2014 | Volant | H01L 21/76879 257/621 |
| 2014/0264926 A1 | 9/2014 | Wu et al. | |

OTHER PUBLICATIONS

El Farhane, R. et. al., "A successful implementation of Dual Damascene architecture to copper TSV for 30 high density applications," 30 Systems Integration Conference (3DIC), 2010 IEEE International, Nov. 16-18, 2010.

* cited by examiner

METHOD AND APPARATUS FOR BACK END OF LINE SEMICONDUCTOR DEVICE PROCESSING

This application is a divisional application of U.S. patent Ser. No. 13/891,578, filed May 10, 2013, entitled "Method and Apparatus for Back End of Line Semiconductor Device Processing," which claims priority to U.S. Provisional Application Ser. No. 61/777,219, filed Mar. 12, 2013, which applications are incorporated herein by reference in its entirety.

BACKGROUND

Generally, integrated circuits (ICs) comprise individual devices, such as transistors, capacitors, or the like, formed on a substrate. One or more metal layers are then formed over the individual devices to provide connections between the individual devices and to provide connections to external devices. The front-end-of-line (FEOL) is the first portion of IC fabrication where the individual devices (transistors, capacitors, resistors, etc.) are patterned in a wafer. FEOL generally covers everything up to (but not including) the deposition of metal layers. The back end of line (BEOL) is the second portion of IC fabrication where the individual devices get interconnected with wiring or metal layers on the wafer. BEOL generally begins when the first metal layer is deposited on the wafer. It includes contacts, insulating layers, metal layers, and bonding sites for chip-to-package connections.

The metal layers interconnecting individual devices typically comprise an inter-metal dielectric (IMD) layer in which interconnect structures, such as vias and conductive lines, are formed, through numerous and repetitive steps of deposition, patterning and etching of thin films on the surface of silicon wafer. Interconnections between different metal layers are made by vias, which go through insulating IMD layers separating metal layers and allow for communications between devices formed at metal layers to communicate with other devices in the metal layers or directly with the semiconductor devices in the substrate.

The IMD layers may be etched to create via openings, via holes, or trenches for conduction lines for metal layers. The etch process generally has certain over etch or under etch amount around the via openings, via holes, or trenches, due to overall process variation. It is possible that a via opening is over etched so that a via does not fully land on the under-layer metal, causing via to under-layer dielectric recess. It is also possible a via opening is not etched enough, causing via depth loading. Furthermore, a misplaced via may be risky for via to under-layer metal bridge causing circuit failure. New methods and apparatus are needed to avoid via to under-layer dielectric recess, via depth loading, and via to under-layer metal bridge issues.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
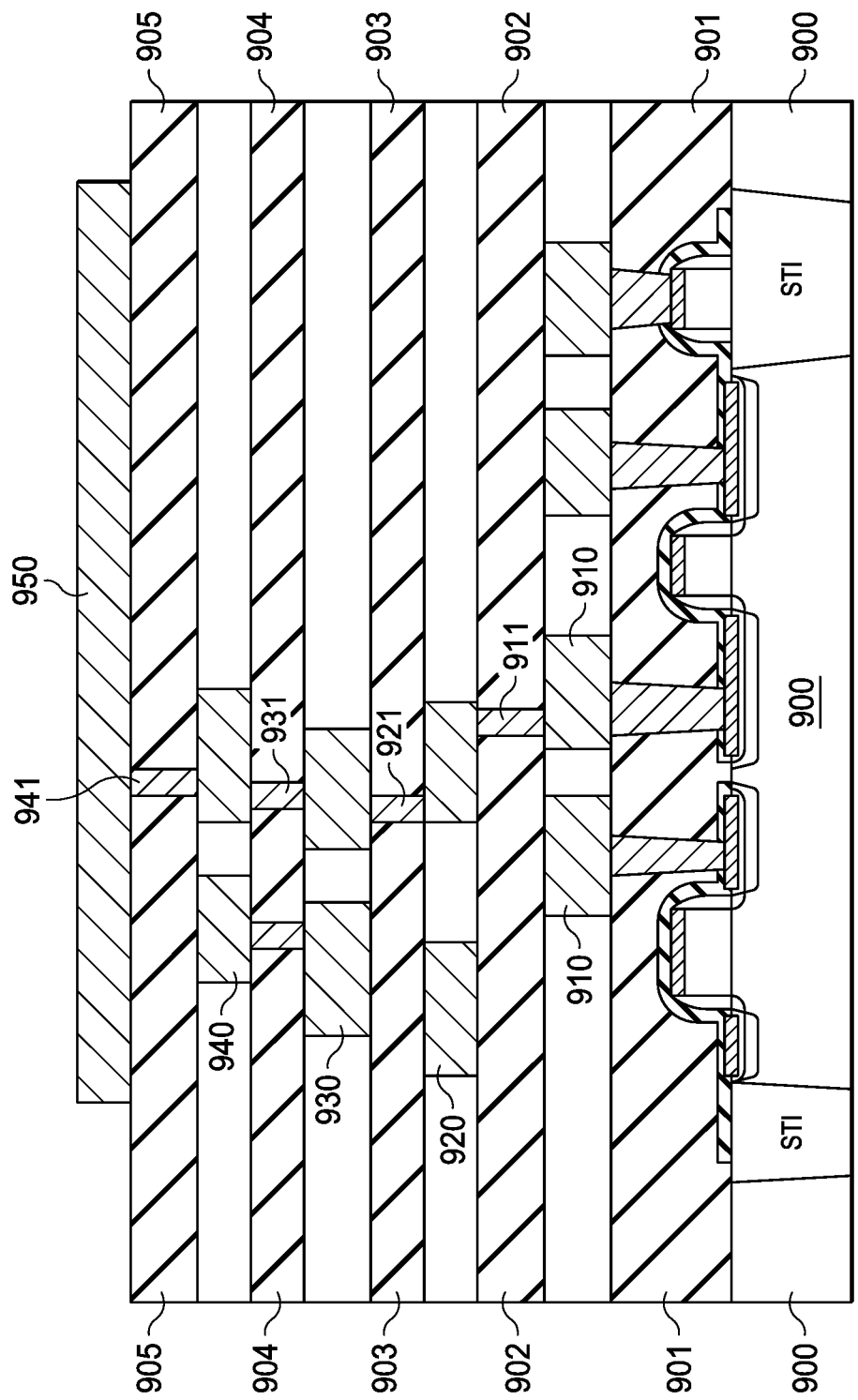
FIG. 1 illustrates in a cross sectional view various metal layers formed on individual devices of an integrated circuit (IC) in accordance with some embodiment.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

A via opening comprising an etch stop layer (ESL) opening and methods of forming the same are provided in accordance with various exemplary embodiments, which can be used in the back end of line (BEOL) process of IC fabrication. A metal feature is provided with a first part within a dielectric layer and with a top surface. An ESL is formed with a bottom surface of the ESL above and in contact with the dielectric layer, and a top surface of the ESL above the bottom surface of the ESL. An opening at the ESL is formed exposing the top surface of the metal feature; wherein the opening at the ESL has a bottom edge of the opening above the bottom surface of the ESL, a first sidewall of the opening at a first side of the metal feature, and a second sidewall of the opening at a second side of the metal feature. The ESL opening exposing the metal feature is separated from any other metal features within the same dielectric layer. The ESL opening around the metal feature while exposing the top surface of the metal feature can make via formed within the ESL opening to be connected to the metal feature without via to under-layer dielectric recess, via depth loading, and via to under-layer metal bridge issues.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 illustrates in a cross sectional view various metal layers formed on individual devices of an integrated circuit (IC) in accordance with some embodiment. An illustrative IC is shown in FIG. 1 comprising individual devices, such as transistors, capacitors, or the like, formed on a substrate 900. Multiple metal layers 910, 920, 930, 940, and 950 are then formed over the individual devices to provide connections among the individual devices and to provide connections to external devices. On top of the substrate layer 900 is a layer 901 which is the first inter-layer dielectric (ILD) between a first metal layer 910 and the substrate layer 900. On top of the ILD layer 901 is the first metal layer 910, where a plurality of metal contacts are located and connected to the devices within the substrate layer 900 by vias through the ILD layer 901. The first metal layer 910 may be called the metal layer $M_1$. A second metal layer 920, which may be called the metal layer $M_2$, is located on top of the first metal layer 910 separated by an inter-metal dielectric (IMD) layer 902. Similarly, additional metal layers 930, 940, and 950 are formed on top of each other and separated by IMD layers 903, 904, and 905, respectively. Metal contacts between different metal layers are connected by vias such as via 911, 921, 931, and 941, respectively. The number of metal layers 910 to 950 and the number of vias 911-941 connecting the metal layers are only for illustrative purposes and are not limiting. There could be other number of layers that is more or less than the five metal layers shown in FIG. 1.

The substrate layer 900 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The substrate 900 may comprise electrical devices such as various n-type metal-oxide semiconductor (NMOS) and/or p-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like.

Shallow trench isolations (STIs), or other isolation structures, may be formed in substrate 900 to isolate device regions. STIs may be formed by etching substrate 900 using photolithography techniques to form recesses. Generally, photolithography involves depositing a photoresist material, which is then masked, exposed, and developed. After the photoresist mask is patterned, an etching process may be performed to remove unwanted portions of the substrate 900. In an embodiment in which the substrate comprises bulk silicon, the etching process may be a wet or dry, anisotropic or isotropic, etching process. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 900. The planarization step may be accomplished, for example, using a chemical mechanical polishing (CMP) process known and used in the art.

A first insulating layer 901, e.g., an inter-layer dielectric (ILD) layer, is formed over the substrate 900. The ILD layer 901 may comprise a low dielectric constant (k value less than about 3.0) or an extreme low dielectric constant (k value less than about 2.5) material. For example, the ILD layer 901 may comprise an oxide, silicon dioxide ($SiO_2$), borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). A planarization process, such as a CMP process, may be performed to planarize the ILD layer 901.

The process forming the individual devices such as transistors, capacitors, resistors, diodes, photo-diodes, fuses, STIs, and the like, within the substrate 900 and the ILD layer 901 may be collectively referred as the front-end-of-line (FEOL) process, which is the first portion of IC fabrication where the individual devices (transistors, capacitors, resistors, etc.) are patterned in a wafer. FEOL generally covers everything up to (but not including) the deposition of metal layers.

Following the FEOL process is the back end of line (BEOL) process, which is the second portion of IC fabrication where the individual devices are interconnected with wiring or metal layers 910 to 950 on the IC as shown in FIG. 1. The BEOL process generally begins when the first metal layer 910 or $M_1$ is deposited on the wafer. It includes contacts, insulating layers, metal layers, and bonding sites for chip-to-package connections. As the result, the metal layers 910 to 950 as illustrated in FIG. 1, or one or more metal layers $M_1$-$M_n$ in general, may be formed over the ILD layer 901. A typical IC may comprise three or more metal layers, followed by a final passivation layer, not shown in FIG. 1. The final passivation layer may be used for protecting the IC from mechanical abrasion during probe and packaging and to provide a barrier to contaminants. After the final passivation layer, the bond pads for input/output will be opened, followed by the normal post-fabrication process such as wafer probe, die separation, and packaging.

In more details, the BEOL process may comprise a sequence of steps: adding a metal layer $M_1$, adding an intra-metal dielectric (IMD) layer, making vias through the IMD layer to connect to lower metal layer contacts, and forming higher metal layer contacts connected to the vias, or creating vias and conductive lines of a higher metal layer by etching via holes and trenches for the conductive lines at the same time. The metal layers 910 to 950 shown in FIG. 1 are separated by IMD layers 902 to 905. The IMD layers 902 to 905 may comprise multiple sub-layers. The IMD layers 902 to 905 may comprise a dielectric layer and an etching stop layer (ESL). A dielectric layer may comprise a low dielectric constant or an extreme low dielectric constant (ELK) material. A planarization process, such as a chemical-mechanical polish (CMP) process, may be performed to planarize the various IMD layers.

The metal layers 910 to 950 as illustrated in FIG. 1, or one or more metal layers $M_1$-$M_n$ in general, may be formed of any suitable conductive material, such as a highly-conductive metal, low-resistive metal, elemental metal, transition metal, or the like. In an embodiment the metal layers $M_1$-$M_n$ may be formed of copper (Cu), although other materials, such as tungsten (W), aluminum (Al), gold (Au), or the like, could alternatively be utilized. Copper (Cu) has a more desirable thermal conductivity and is available in a highly pure state. In an embodiment in which the metal layers $M_1$-$M_n$ are formed of copper (Cu), the metal layers $M_1$-$M_n$ may be deposited by electroplating techniques, although any method of formation could alternatively be used.

The metal layers 910 to 950 as illustrated in FIG. 1, or one or more metal layers $M_1$-$M_n$ in general, may be formed, using a plating and etching process through a damascene or dual-damascene process, in which openings are etched into the corresponding dielectric layer and the openings are filled with a conductive material such as Cu. The damascene process means formation of a patterned layer imbedded on and in another layer such that the top surfaces of the two layers are coplanar. An IMD is deposited either directly on a substrate, or on top of another existing metal layer. Once the IMD is deposited, portions of the IMD may be etched away to form recessed features, such as trenches and vias, which can connect different regions of the IC and accommodate the conductive lines. A damascene process which creates either only trenches or vias is known as a single damascene process. A damascene process which creates both trenches and vias at once is known as a dual damascene process. Damascene and dual-damascene processes use lower resistance metals such as copper (Cu) to form many metal elements (e.g. lines, interconnects, and the like) instead of the conventionally used aluminum (Al).

Interconnections between different metal layers are made by vias, such as the vias 911, 921, 931, and 941 as shown in FIG. 1. A via goes through an insulating IMD layer separating two metal layers, and connects to another metal feature to allow for communication between interconnects of other metal layers or directly with the semiconductor devices in the substrate. An IMD layer 902, 903, 904, or 905 may be etched to create a via opening, a via hole, or a trench for a conduction line. The etch process generally has certain over etch or under etch amount around the via opening, the via hole, or the trench, due to overall process variation. It is possible that a via opening is over etched so that a via does not fully land on the under-layer metal, causing via to under-layer dielectric recess. It is also possible a via opening is not etched enough, causing via depth loading. Furthermore, a misplaced via may be risky for via to under-layer metal bridge causing circuit failure. More details of an IMD layer, a via opening, a via, and the connection between a via and other metal feature are shown in FIGS. 2(a)-2(g), and FIGS. 3(a)-3(g), which can prevent the problems stated above.

Figure 2A:
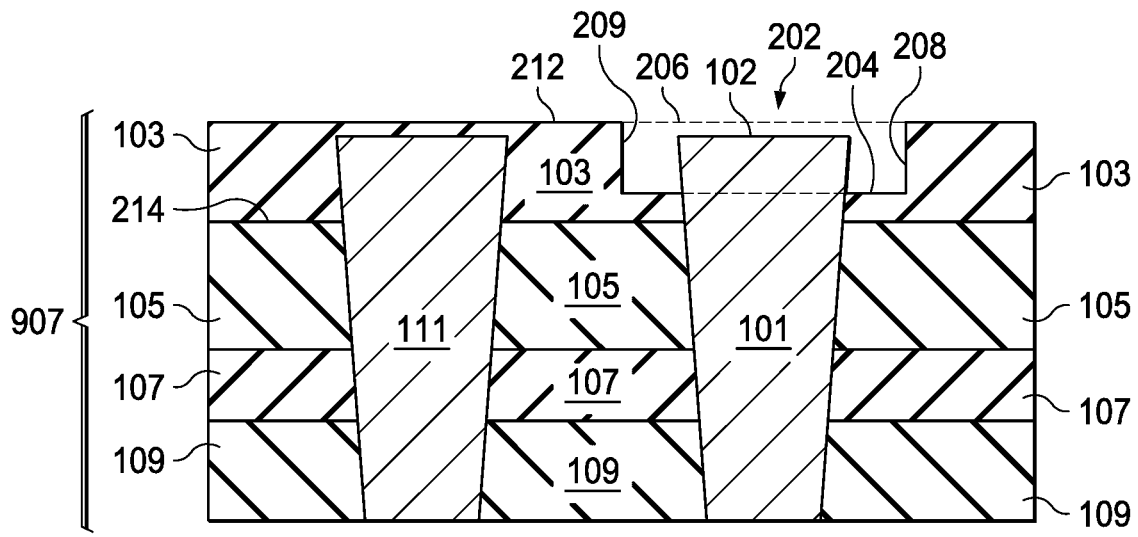
FIGS. 2(a)-2(g) illustrate in cross sectional views an etch stop layer (ESL) opening exposing a metal feature in a metal layer, in accordance with some embodiments.
Figure 2B:
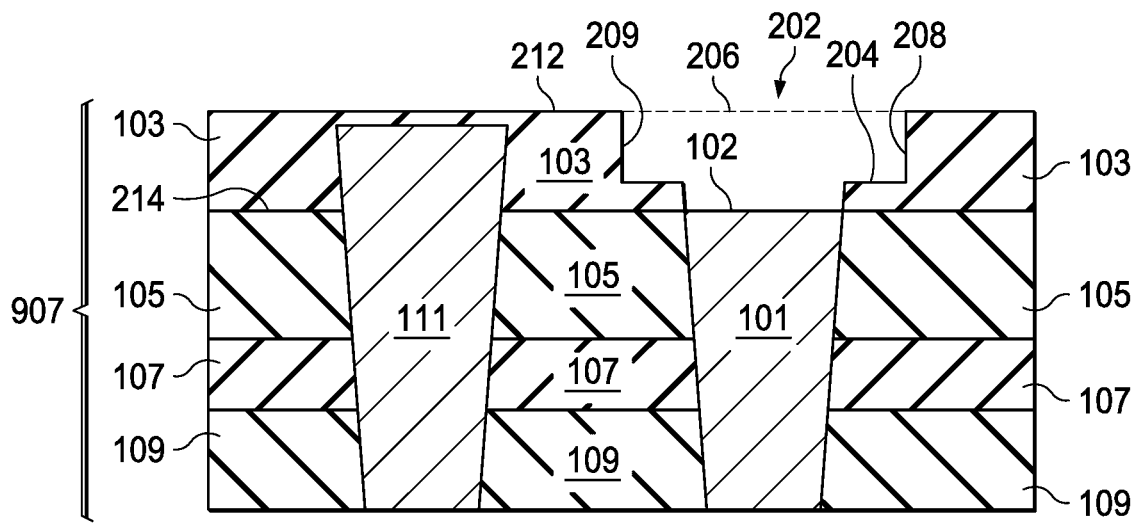
Figure 2C:
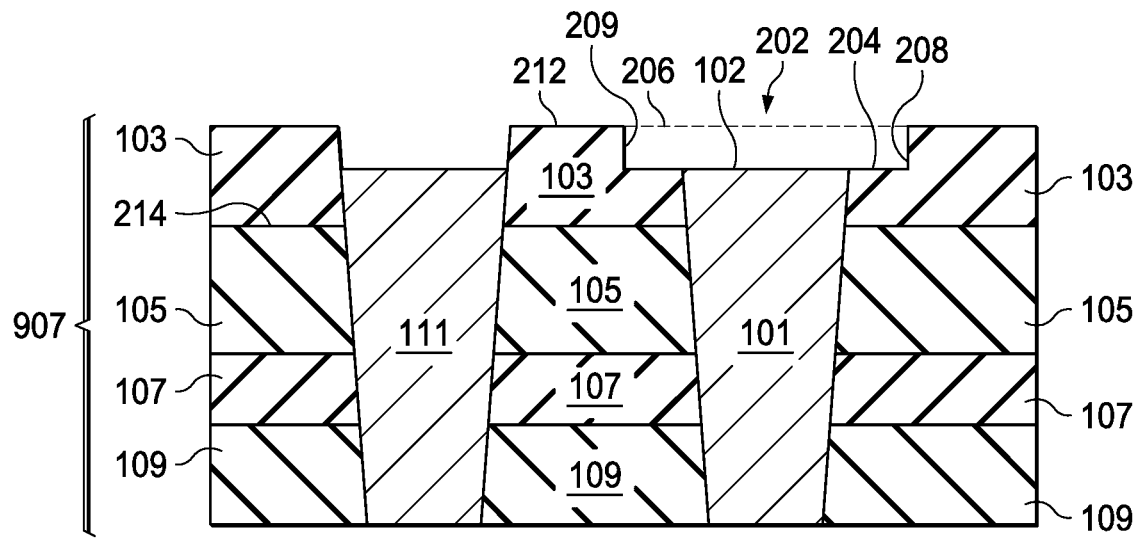
Figure 2D:
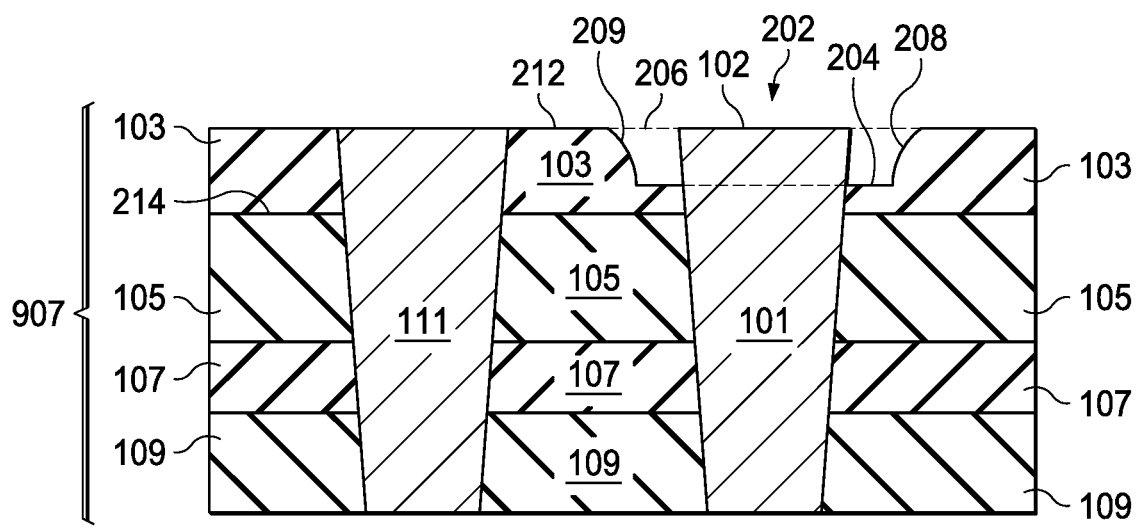

FIGS. 2(a)-2(g) illustrate in cross sectional views an IMD layer 907 comprising a plurality of dielectric layers 109 and 105, and a plurality of etch stop layers (ESLs) 103 and 107. The IMD layer 907 may be any of the IMD layers 902-905 shown in FIG. 1. The dielectric layers 105 and 109, and the ESLs 103 and 107 are the sub-layers of the IMD layer 907. There may be multiple dielectric layers such as the dielectric layer 105 and 109 for the IMD layer 907. In between two dielectric layers 105 and 109 may be an ESL 107. The dielectric layer 109 and the ESL layer 107 are optional. The IMD layer 907 may have a dielectric layer 105 and an ESL 103 only without the layers 107 and 109. There may be other dielectric layer formed above the ESL 103, which is shown in FIGS. 3(i)-3(k). A metal feature 101 is contained within the IMD layer 907. The IMD layer 907 may contain additional metal features such as the metal feature 111. As illustrated in FIGS. 2(a)-2(g), the metal feature 101 goes through the dielectric layers 105 and 109.

The dielectric layer 105 and 109 may comprise a material, such as an oxide, silicon dioxide ($SiO_2$), borophosphosilicate glass (BPSG), tetra-ethyl-ortho-silicate (TEOS), spin-on glass (SOG), undoped silicate glass (USG), fluorinated silicate glass (FSG), high-density plasma (HDP) oxide, or plasma-enhanced TEOS (PETEOS). The dielectric layers 105 and 109 may comprise a SiOC-based spin-on material that can be applied to or deposited by a spin-on method, such as spin coating. The dielectric layers 105 and 109 may each have a thickness of from about 300 Å to about 1200 Å.

The ESL 107 may be formed in between two dielectric layers 105 and 109. The etching stop layer (ESL) 103 may be formed above the dielectric layer 105. The ESL 103 has a bottom surface 214 above and in contact with the dielectric layer 105, and a top surface 212 of the ESL 103 is above the bottom surface 214 of the ESL 103. The ESLs 103 and 107 protect any underlying layer or layers during the etching process. Materials for the ESLs 103 and 107 may include SiC, SiCN, SiOC, AlN, SIN, TEOS, or hard black diamond (HBD), or the like. Alternatively, the ESL 103 may be formed by depositing and annealing a metal oxide material, which may include hafnium (Hf), hafnium oxide (HfO2), or aluminum (Al). The material used for the ESLs 103 and 107 may depend on the materials used for the dielectric layers 109 and 105, in addition to the dielectric layer above the ESL 103. The selection of the material for the ESLs 103 and 107 may be based on the desired etch rate difference between the etch rate for the ESLs 103 and 107 and the etch rate for the dielectric layers 109 and 105 and the dielectric layer above the ESL 103. For example, the selection of the material may make the etch rate of the ESLs 103 and 107 to be 90% slower than the etch rate of the dielectric layers. Alternatively, the etching rate for the dielectric layers 109 and 105 may be at a rate about 640 Å/min, while the etching rate for the ESLs 103 and 107 may be at a range from about 170 Å/min to about 440 Å/min.

Those layers 103, 105, 107, and 109 may be deposited by methods including chemical vapor deposition (CVD), plasma enhanced chemical vapor deposition (PECVD), high density plasma chemical vapor deposition (HDP-CVD) and atmospheric pressure chemical vapor deposition (APCVD).

FIGS. 2(a)-2(g) illustrate a metal feature 101 within the IMD layer 907. The metal feature 101 may be a via or a conductive line in a lower metal layer, which may be any of the metal layers 910 to 940 shown in FIG. 1. A second metal feature 111 may be formed separated from the metal feature 101. The metal features 101 and 111 may be formed of any suitable conductive material, such as a highly-conductive metal, low-resistive metal, elemental metal, transition metal, or the like. In an embodiment the metal features 101 and 111 may be formed of copper (Cu), although other materials, such as tungsten (W), aluminum (Al), gold (Au), or the like, could alternatively be utilized.

FIGS. 2(a)-2(g) illustrate an ESL opening 202 of the ESL 103 which exposes a top surface 102 of the metal feature 101. The ESL opening 202 may be a part of a via opening shown in FIG. 3(j), where the via opening further comprises an opening 302 at a dielectric layer 301 above the ESL 103. The ESL opening 202 around the metal feature 101 while exposing the top surface 102 of the metal feature 101 can make via formed within the ESL opening 202 to be connected to the metal feature 101 without via to under-layer dielectric recess, via depth loading, and via to under-layer metal bridge issues. As later shown in FIG. 3(k), a via 303 and a metal line 305 may be connected to the metal feature 101 filling the ESL opening 202 shown in FIGS. 2(a)-2(g).

The metal feature 101 has a top surface 102. As shown in FIGS. 2(a), 2(c), and 2(d), the top surface 102 of the metal feature 101 is above the dielectric layer 105, while a part of the metal feature 101 may be within the dielectric layer 105. The height of the top surface 102 of the metal feature 101 above the dielectric layer 105 may be in a range from about 50 Å to about 150 Å. Alternatively, as shown in FIG. 2(b), the top surface 102 of the metal feature 101 may be substantially horizontally aligned with the surface of the dielectric layer 105 when the metal feature 101 is all within the dielectric layers 105 and 109. Similarly, the top surface 102 of the metal feature 101 may be below the top surface 212 of the ESL 103, as shown in FIGS. 2(a)-2(c). Alternatively, the top surface 102 of the metal feature 101 may be substantially horizontally aligned with the top surface 212 of the ESL 103, as shown in FIG. 2(d).

The opening 202 of the ESL 103 may be formed to expose the top surface 102 of the metal feature 101. The depth of the opening 202 may be in a range from about 50 Å to about 150 Å. The opening 202 at the ESL 103 exposing the top surface 102 of the metal feature 101 may not expose the second metal feature 111. The opening 202 has a bottom edge 204 which is above the bottom surface 214 of the ESL 103. The opening 202 has a first sidewall 208 at a first side of the metal feature 101, and a second sidewall 209 of the opening 202 at a second side of the metal feature 101. The bottom edge 204 of the opening 202 at the ESL may be lower than the top surface 102 of the metal feature 101, as shown in FIGS. 2(a) and 2(d). Alternatively, the bottom edge 204 of the opening 202 at the ESL 103 may be substantially horizontally aligned with the top surface 102 of the metal feature 101, as shown in FIG. 2(c). Still alternatively, the bottom edge 204 of the opening 202 at the ESL may be above the top surface 102 of the metal feature 101, as shown in FIG. 2(b).

Figure 2E:
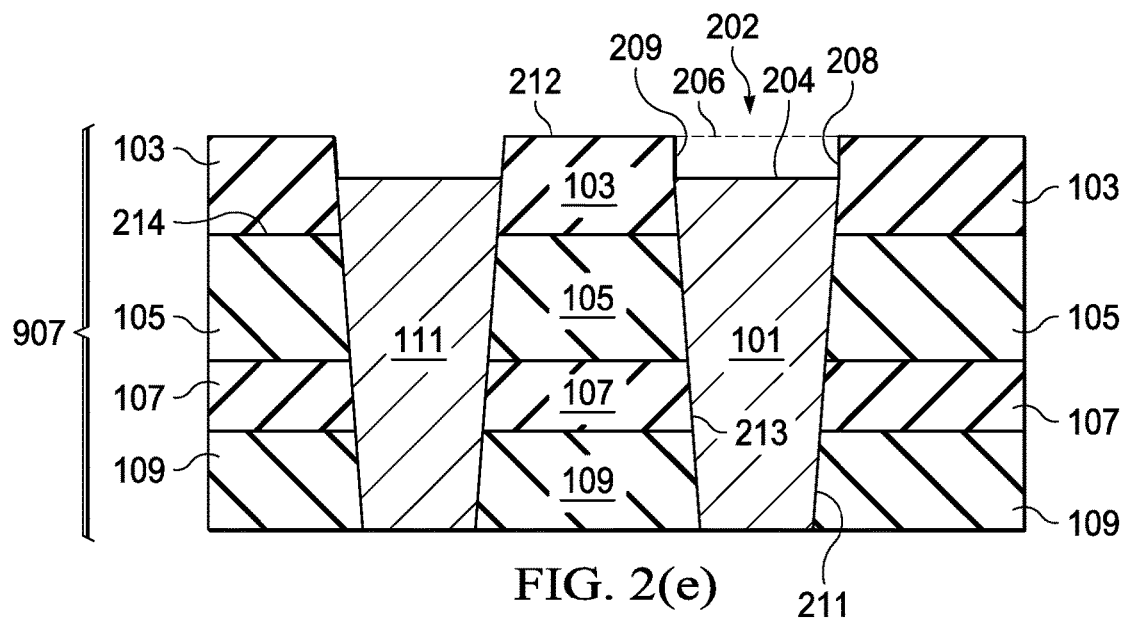

The first sidewall 208 of the opening 202 may be substantially aligned to a first edge 211 of the metal feature 101, as shown in FIG. 2(e). The second sidewall 209 of the opening 202 may be substantially aligned to a second edge 213 of the metal feature 101, as shown in FIG. 2(e). Alternatively, there may be a gap between the first sidewall 208 and the second sidewall 209 of the opening 202 and an edge of the metal feature 101, as shown in FIGS. 2(a) and 2(d). The opening 202 at the ESL 103 may be of a rectangle shape, as shown in FIG. 2(a). Alternatively, the opening 202 at the ESL 103 may be of a circle, a square, an octagon, an oval, or a diamond, or any other irregular shape, as shown in FIG. 2(d).

Figure 2F:
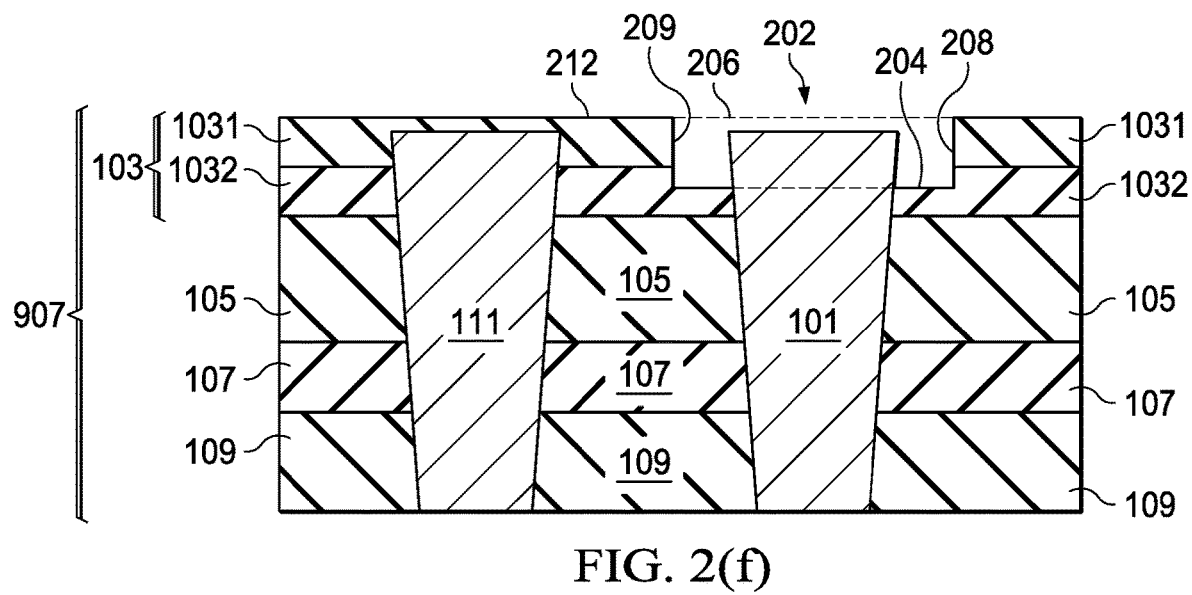
Figure 2G:
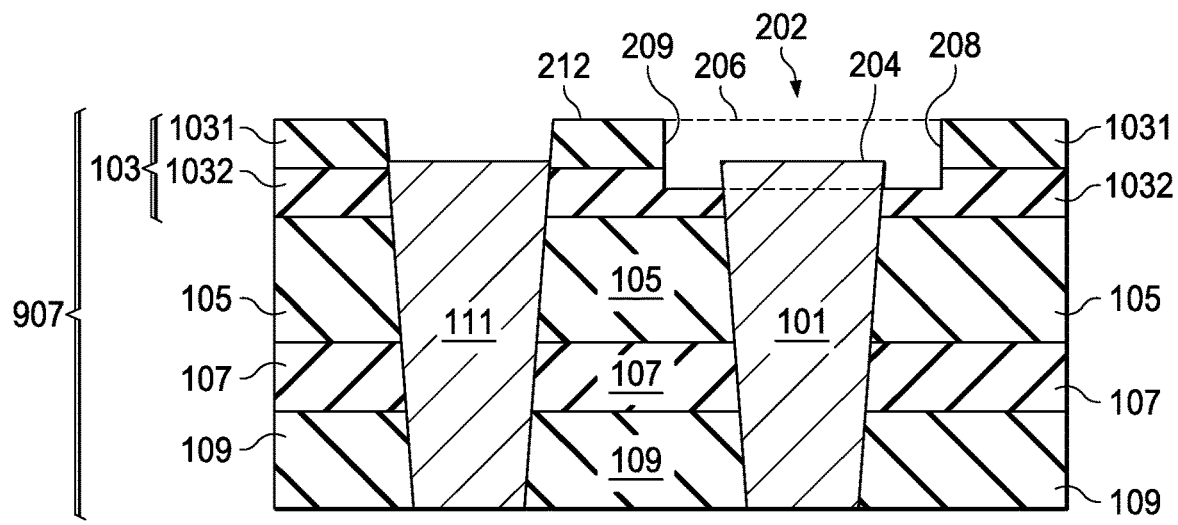

Some additional embodiments are shown in FIGS. 2(f)-2(g), where the ESL 103 may comprise two sub-layers 1031 and 1032. The ESL 103 comprises a first sublayer 1031 made of a first material and a second sublayer 1032 made of a second material. The first material may be a conventional ESL material such as SiCN or SiOC, while the second material may be a new ESL material such as AlN, and vice versa. Alternatively, the first material and the second material may be any different ESL materials. The opening 202 at the ESL goes through the first sublayer 1031 and comprises a part opening at the second sublayer 1032 to expose the top surface 102 of the metal feature 101 as illustrated in FIG. 2(f). Alternatively, the opening 202 at the ESL comprises an opening at the first sublayer 1031 only to expose the top surface 102 of the metal feature 101, as illustrated in FIG. 2(g).

FIGS. 3(a)-3(k) illustrate in cross sectional views a process of making an etch stop layer (ESL) opening 202 exposing a top surface 102 of a metal feature 101, in accordance with some embodiments. The ESL opening 202 may be a part of a via opening shown in FIG. 3(j), where the via opening further comprises an opening 302 at a dielectric layer 301 above the ESL 103. The ESL opening 202 around the metal feature 101 while exposing the top surface 102 of the metal feature 101 can make via formed within the ESL opening 202 to be connected to the metal feature 101 without via to under-layer dielectric recess, via depth loading, and via to under-layer metal bridge issues. As shown in FIG. 3(k), a via 303 and a metal line 305 may be connected to the metal feature 101 filling the ESL opening 202 shown in FIGS. 2(a)-2(g).

Figure 3A:
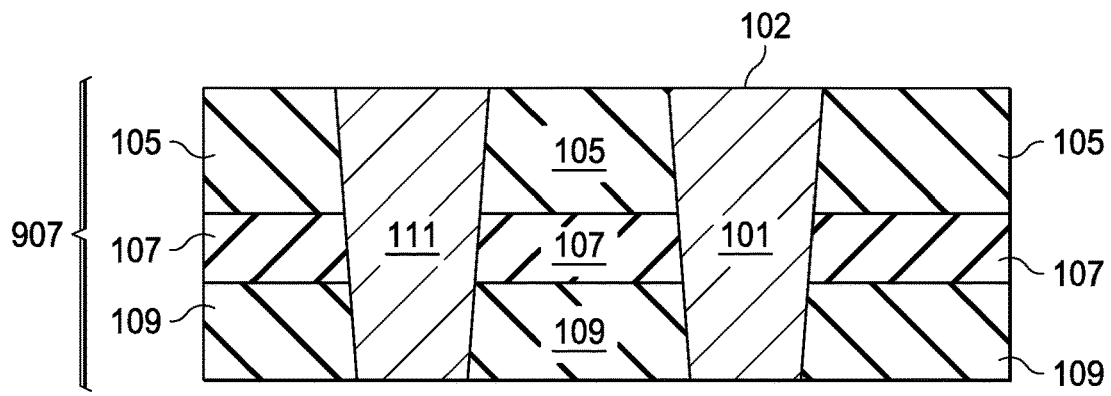
FIGS. 3(a)-3(k) illustrate in cross sectional views a process of making an etch stop layer (ESL) opening exposing a metal feature in a metal layer, in accordance with some embodiments.

As illustrated in FIG. 3(a) in a cross sectional view, a part of an IMD layer 907 may be provided. The part of the IMD layer 907 comprises a plurality of dielectric layers 109 and 105, and an ESL 107 between the dielectric layer 105 and 109. The dielectric layers 105 and 109, and the ESL 107 are the sub-layers of the IMD layer 907. The dielectric layer 109 and the ESL layer 107 are optional. The part of the IMD layer 907 may have a dielectric layer 105 only without the layers 107 and 109.

A metal feature 101 is contained within the IMD layer 907. The IMD layer 907 may contain additional metal features such as the metal feature 111. The metal feature 101 goes through the dielectric layers 105 and 109. A top surface 102 of the metal feature 101 is substantially horizontally aligned with the top of the dielectric layer 105.

Figure 3B:
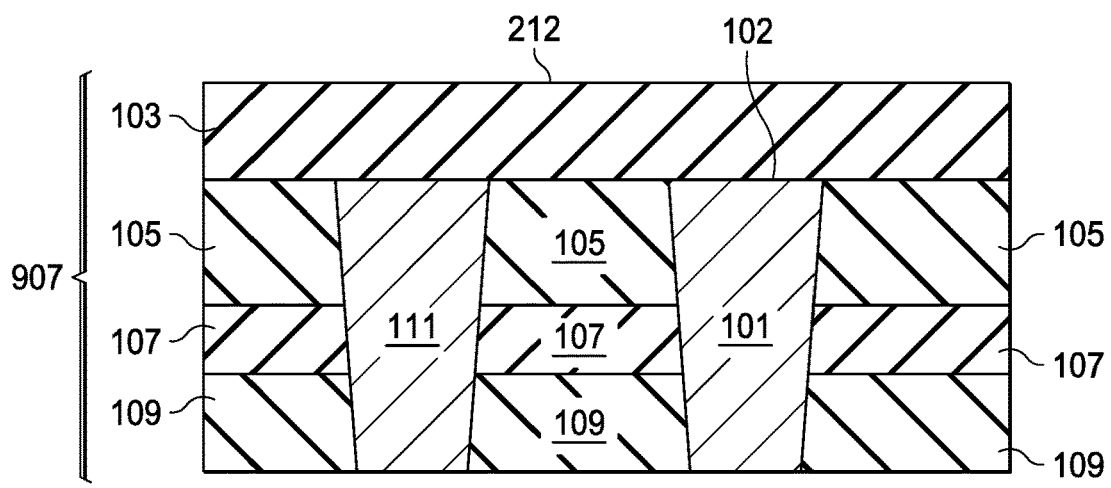
Figure 3C:
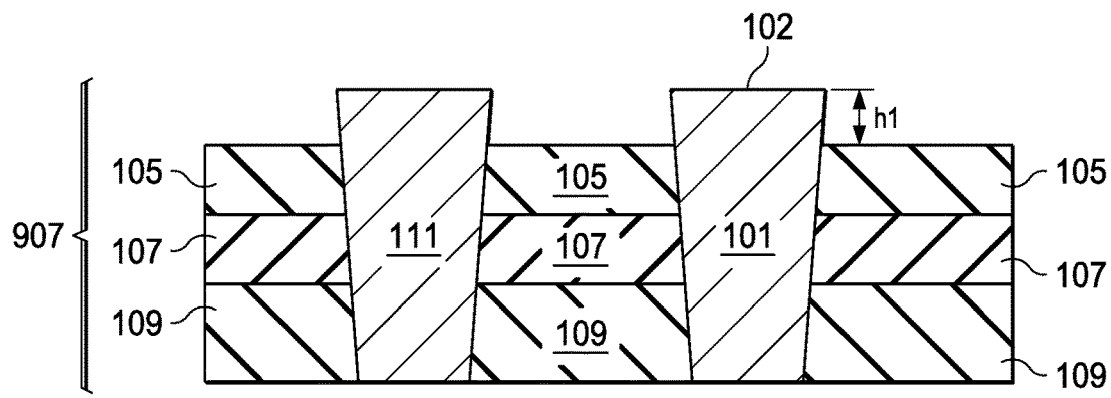
Figure 3D:
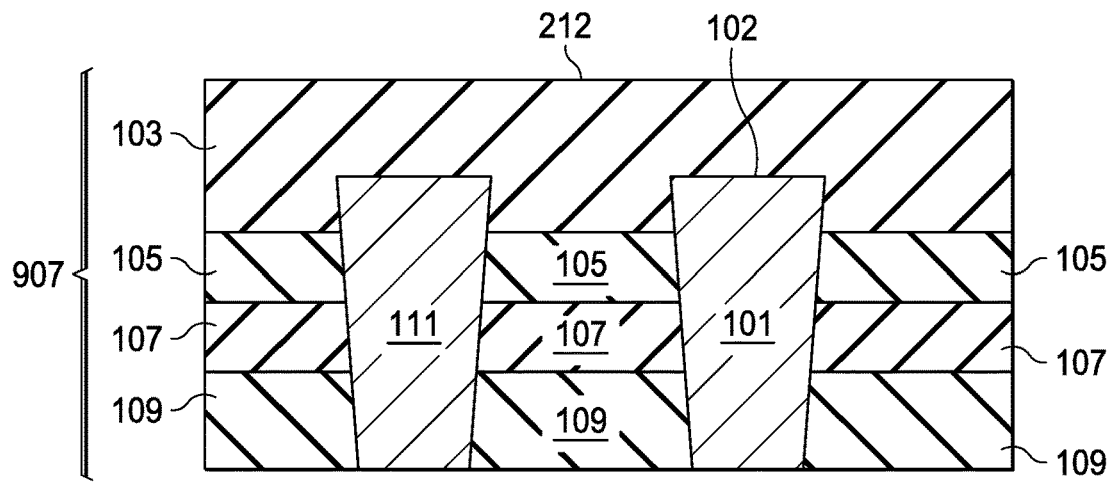

As illustrated in FIGS. 3(b) and 3(d), an ESL 103 may be formed with a bottom surface of the ESL above and in contact with the dielectric layer 105, and a top surface 212 of the ESL above the bottom surface of the ESL. The ESL 103 may be formed in various different ways. As illustrated in FIG. 3(b), the ESL 103 may be formed on the dielectric layer 105 as provided in FIG. 3(a), where the top surface 102 of the metal feature 101 is aligned with the surface of the dielectric layer 105. Alternatively, the dielectric layer 105 may be etched away so that the top surface 102 of the metal feature 101 is above the dielectric layer 105, as illustrated in FIG. 3(c). An ESL 103 can then be formed on the new dielectric layer 105 as illustrated in FIG. 3(d). As illustrated in FIGS. 3(c)-3(d), the top surface 102 of the metal feature 101 is above the dielectric layer 105, while a part of the metal feature 101 may be within the dielectric layer 105. The height h1 of the top surface 102 of the metal feature 101 above the dielectric layer 105 may be in a range from about 50 Å to about 150 Å. Alternatively, as shown in FIG. 3(b), the top surface 102 of the metal feature 101 may be substantially horizontally aligned with the surface of the dielectric layer 105 when the metal feature 101 is all within the dielectric layers 105 and 109.

Figure 3E:
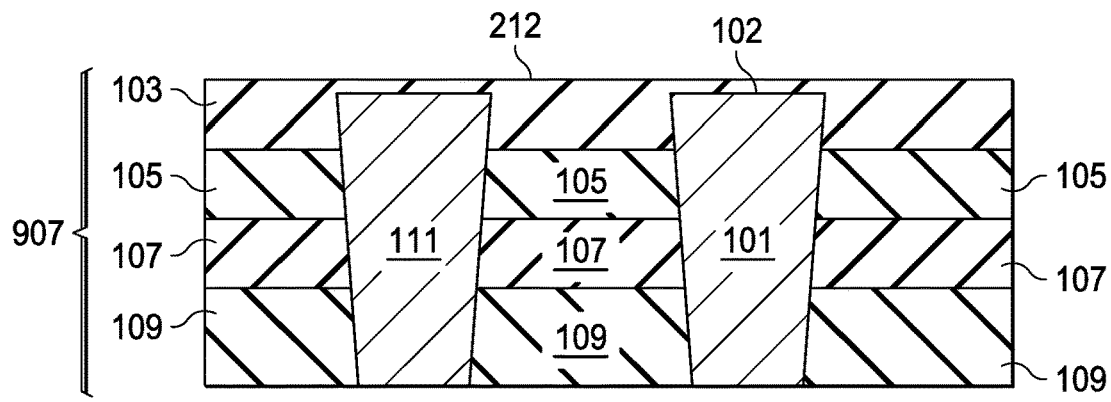
Figure 3F:
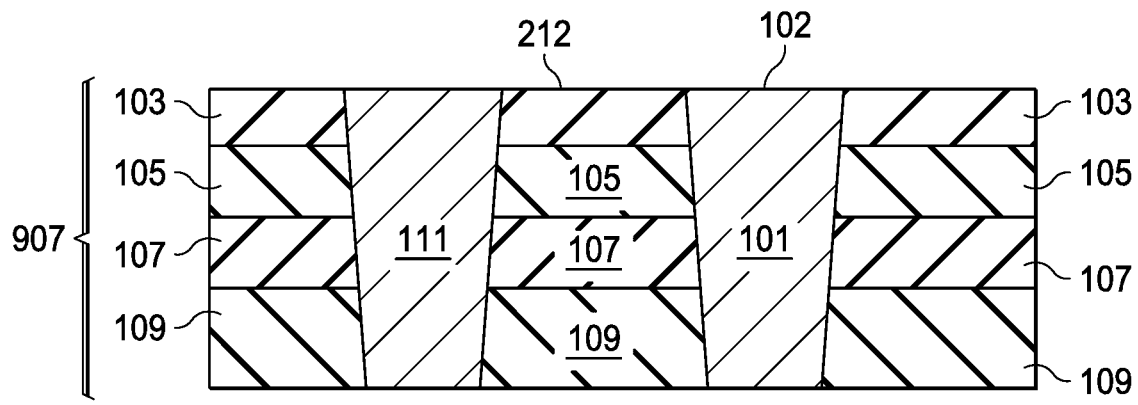
Figure 3G:
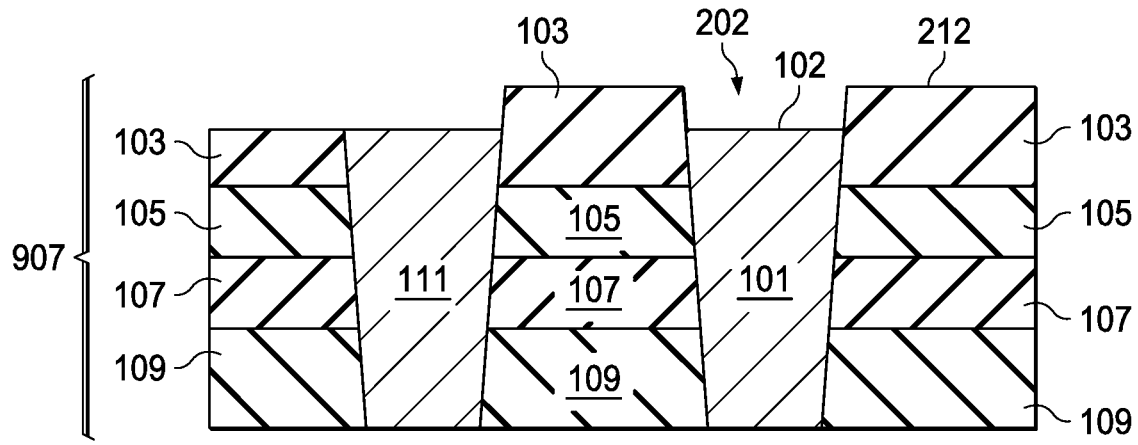
Figure 3H:
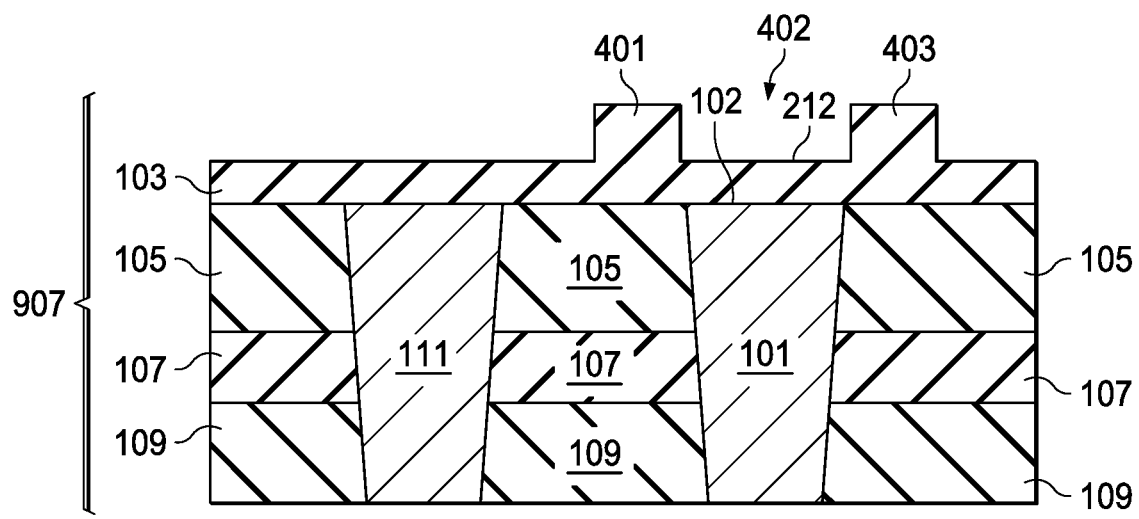
Figure 3I:
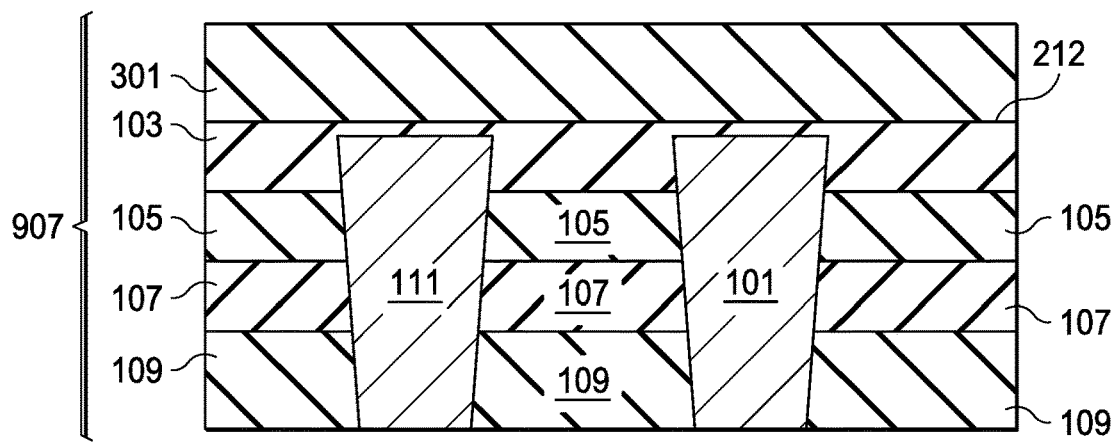
Figure 3J:
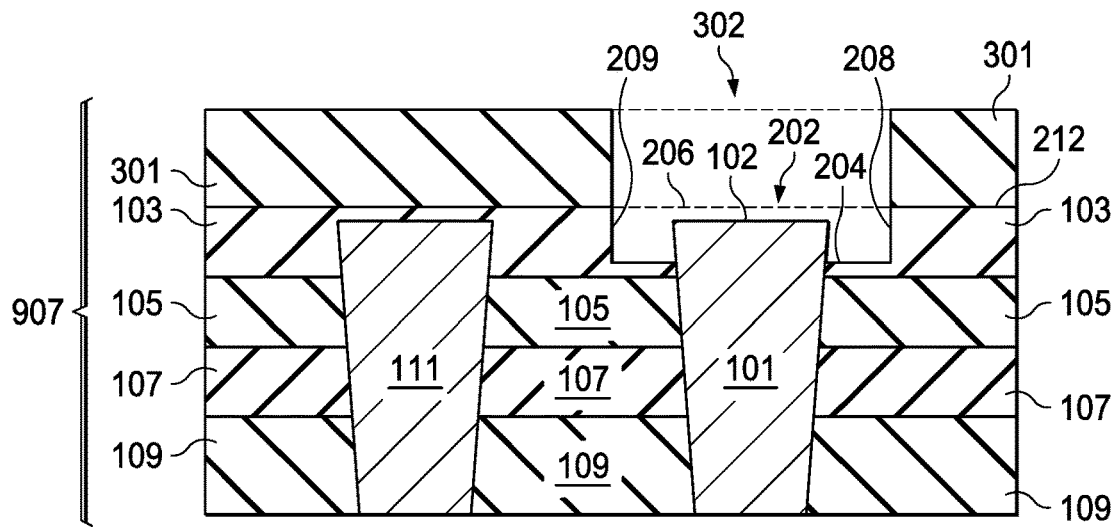
Figure 3K:
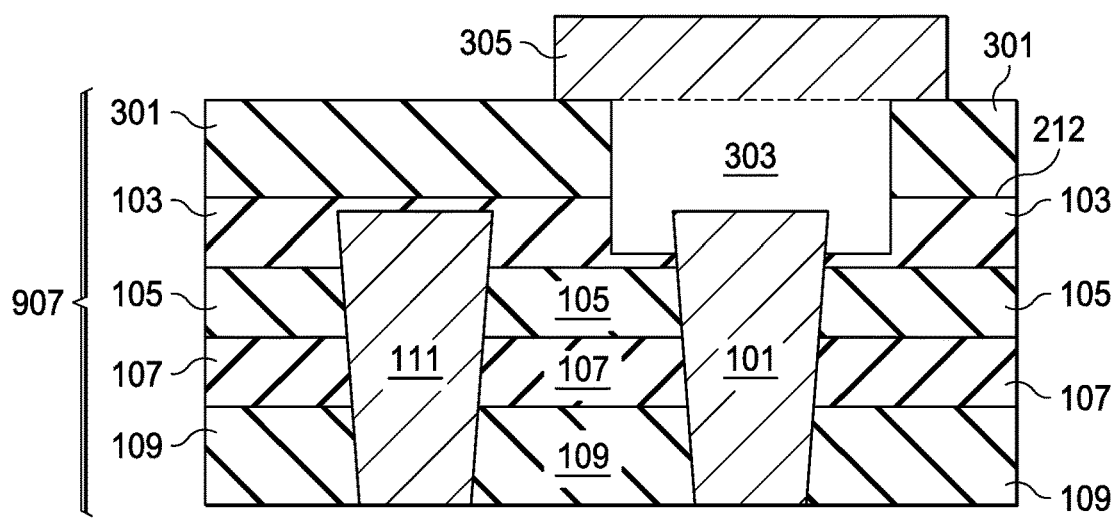

The ESL 103 formed as shown in FIG. 3(b) or 3(d) can be further processed, as illustrated in FIGS. 3(e)-3(h). As illustrated in FIG. 3(e), the top surface 212 of the ESL 103 may be further etched to be thinner than the first formed in FIG. 3(h), yet still fully cover the top surface 102 of the metal feature 101. Alternatively, as illustrated in FIG. 3(f), the top surface 212 of the ESL 103 may be further etched to be thinner and substantially horizontally aligned with the top surface 102 of the metal feature 101. Alternatively, as illustrated in FIG. 3(g), the top surface 212 of the ESL 103 may be further etched to be thinner but still higher than the top surface 102 of the metal feature 101, yet there is an opening 202 above the top surface 102 of the metal feature 101. Still alternatively, as illustrated in FIG. 3(h), the top surface 212 of the ESL 103 may be further etched to form a pattern with an opening 402 above the top surface 102 of the metal feature 101, surrounded by two parts 401 and 403 which are higher than the other part of the top surface 212 of the ESL 103.

The processed ESL 103 shown in FIGS. 3(e)-3(h) may be covered by a dielectric layer. FIG. 3(i) shows a dielectric layer 301 covering the ESL 103 as shown in FIG. 3(e). The dielectric layer 301 may be similarly formed to cover the ESL 103 shown in FIGS. 3(f)-3(h), which is not shown. The dielectric layer 301 may be deposited by methods including chemical vapor deposition (CVD), plasma enhanced chemical vapor deposition (PECVD), high density plasma chemical vapor deposition (HDP-CVD) and atmospheric pressure chemical vapor deposition (APCVD).

As illustrated in FIG. 3(j), an opening 302 at the dielectric layer 301 and an opening 202 of the ESL 103 may be formed to expose the top surface 102 of the metal feature 101. The depth of the opening 302 may be in a range from about 500 Å to 1500 Å. The depth of the opening 202 may be in a range from about 50 Å to about 150 Å. The opening 302 at the dielectric layer 301 goes through the dielectric layer 301. The opening 202 at the ESL 103 exposes the top surface 102 of the metal feature 101 while keep any other metal feature such as the metal feature 111 still covered by the ESL 103. The opening 202 has a bottom edge 204 which is above the bottom surface of the ESL 103, and a top edge 206. The opening 202 has a first sidewall 208 at a first side of the metal feature 101, and a second sidewall 209 of the opening 202 at a second side of the metal feature 101.

As shown in FIG. 3(j), the bottom edge 204 of the opening 202 at the ESL 103 may be lower than the top surface 102 of the metal feature 101. There may be a gap between the first sidewall 208 of the opening 202 and an edge of the metal feature 101. There may be a gap between the second sidewall 209 of the opening 202 and an edge of the metal feature 101 as well. The opening 202 at the ESL 103 may be of a rectangle shape.

Alternatively, the bottom edge 204 of the opening 202 at the ESL 103 may be substantially horizontally aligned with the top surface 102 of the metal feature 101, as shown in FIG. 2(c). Still alternatively, the bottom edge 204 of the opening 202 at the ESL may be above the top surface 102 of the metal feature 101, as shown in FIG. 2(b). The first sidewall 208 of the opening 202 may be substantially aligned to a first edge 211 of the metal feature 101, as shown in FIG. 2(e). The opening 202 at the ESL 103 may be of a circle, a square, an octagon, an oval, or a diamond, or any other irregular shape, as shown in FIG. 2(d). All those alternatives are not shown in the process demonstrated by FIGS. 3(a)-3(k).

As illustrated in FIG. 3(k), a via 303 may be formed within the opening 302 and 202 shown in FIG. 3(j). Furthermore, a conductive line 305 may be formed above and connected to the via 303. The via 303 may be formed of a conductive material. The conductive material may be formed by an electro-chemical plating process, CVD, ALD, PVD, a combination thereof, and/or the like. A planarization process, such as a chemical mechanical polishing (CMP) process, may be used to planarize and/or remove excess material. Before forming the via 303, a liner layer, not shown, may be formed over the openings 302 and 202, covering the sidewalls and bottom of the openings 302 and 202. A thin barrier layer may be formed over the liner, if present, or may be deposited covering the sidewalls and a bottom of the openings 302 and 202.

One of the broader forms of the present disclosure involves a device. The device comprises a metal feature having a first part within a dielectric layer and having a top surface of the metal feature. The device comprises an etching stop layer (ESL) with a bottom surface of the ESL above and in contact with the dielectric layer, and a top surface of the ESL above the bottom surface of the ESL. An opening at the ESL exposes the top surface of the metal feature. The opening at the ESL has a bottom edge of the opening above the bottom surface of the ESL, a first sidewall of the opening at a first side of the metal feature, and a second sidewall of the opening at a second side of the metal feature.

Another of the broader forms of the present disclosure involves a method of fabricating an integrated circuit (IC). The method comprises: providing a first dielectric layer; forming a metal feature, wherein the metal feature has a first part within the first dielectric layer and has a top surface of the metal feature; forming an etching stop layer (ESL) with a bottom surface of the ESL above and in contact with the first dielectric layer, and a top surface of the ESL above the bottom surface of the ESL; forming a second dielectric layer above and in contact with the ESL; forming an opening through the second dielectric layer, and further forming an opening at the ESL exposing the top surface of the metal feature; wherein the opening at the ESL has a bottom edge above the bottom surface of the ESL, a first sidewall of the opening at the ESL at a first side of the metal feature, and a second sidewall of the opening at the ESL at a second side of the metal feature.

Still another of the broader forms of the present disclosure involves a device. The device comprises a first metal feature having a first part within a dielectric layer and having a top surface of the first metal feature. The device comprises a second metal feature having a second part within the dielectric layer and separated from the first metal feature. The device further comprises an etching stop layer (ESL) with a bottom surface of the ESL above and in contact with the dielectric layer, and a top surface of the ESL above the bottom surface of the ESL. An opening at the ESL exposes the top surface of the first metal feature and does not expose the second metal feature; wherein the opening at the ESL has a bottom edge of the opening above the bottom surface of the ESL, a first sidewall of the opening at a first side of the first metal feature, and a second sidewall of the opening at a second side of the first metal feature.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of fabricating an integrated circuit (IC), the method comprising:
    forming a first metal feature in a first dielectric layer, the first metal feature protruding through an upper surface of the first dielectric layer;
    after forming the first metal feature in the first dielectric layer, forming a second dielectric layer over the first dielectric layer, the second dielectric layer extending along sidewalls of the first metal feature;
    after forming the second dielectric layer, forming a third dielectric layer over the second dielectric layer and the first metal feature;
    after forming the third dielectric layer, forming a recess in the third dielectric layer, the first metal feature protruding above a bottom surface of the recess, the bottom surface of the recess being below an upper surface of the second dielectric layer, wherein forming the third dielectric layer comprises thinning the third dielectric layer prior to forming the recess; and
    forming a second metal feature in the recess.

2. The method of claim 1, further comprising forming a third metal feature in the first dielectric layer, wherein the third dielectric layer extends over the third metal feature.

3. The method of claim 2, wherein the third dielectric layer extends along sidewalls of the third metal feature.

4. The method of claim 1, wherein forming the second dielectric layer comprises forming a layer of of SiC, SiCN, SiOC, AlN, SIN, tetra-ethyl-ortho-silicate (TEOS), or hard black diamond (HBD).

5. The method of claim 1, wherein the second metal feature extends along sidewalls of the first metal feature.

6. The method of claim 1, further comprising, prior to forming the recess, forming a fourth dielectric layer over the third dielectric layer, and wherein forming the recess comprises forming the recess through the fourth dielectric layer.

7. The method of claim 6, further comprising forming a conductive line over the fourth dielectric layer, the conductive line electrically coupled to the second metal feature.

8. A method of fabricating an integrated circuit (IC), the method comprising:
    forming a first dielectric layer;
    forming a first metal feature in the first dielectric layer;
    recessing the first dielectric layer, the first metal feature protruding above an upper surface of the first dielectric layer after recessing;
    forming an etch stop layer over the first dielectric layer, the etch stop layer covering the first metal feature, wherein forming the etch stop layer comprises:
        forming a first sublayer of a first material; and
        forming a second sublayer over the first sublayer, the second sublayer comprising a second material;
    forming a recess in the etch stop layer, wherein the recess extends through the second sublayer and into the first sublayer, a depth of the recess being less than a thickness of the etch stop layer, the first metal feature extending above a bottom of the recess; and
    forming a second metal feature in the recess.

9. The method of claim 8, wherein the second metal feature extends along sidewalls of the first metal feature.

10. The method of claim 8, wherein the etch stop layer is interposed between the second metal feature and the first dielectric layer.

11. The method of claim 8, further comprising:
    forming a third metal feature in the first dielectric layer, wherein the etch stop layer extends over the third metal feature; and
    forming a second dielectric layer over the etch stop layer, wherein the etch stop layer is interposed between the third metal feature and the second dielectric layer.

12. The method of claim 11, wherein upper surfaces of the first metal feature and the third metal feature are level.

13. The method of claim 8, wherein the second metal feature extends above an uppermost surface of the etch stop layer.

14. A method of fabricating an integrated circuit (IC), the method comprising:
    forming a first conductive feature in a first dielectric layer, the first conductive feature protruding through an upper surface of the first dielectric layer;
    after forming the first conductive feature in the first dielectric layer, forming a second dielectric layer over the first dielectric layer, the second dielectric layer extending along sidewalls of the first conductive feature;
    after forming the second dielectric layer, forming a third dielectric layer over the second dielectric layer;
    after forming the third dielectric layer, forming a recess through the third dielectric layer, an upper surface and sidewalls of the first conductive feature being exposed in the recess; and
    forming a second conductive feature in the recess, the second conductive feature extending over the upper surface and sidewalls of the first conductive feature.

15. The method of claim 14, wherein the recess extends into the second dielectric layer.

16. The method of claim 14, wherein, prior to forming the recess, the third dielectric layer extends along sidewalls of the first conductive feature.

17. The method of claim 14, further comprising forming a third conductive feature in the first dielectric layer, wherein the second dielectric layer extends along sidewalls of the first conductive feature.

18. The method of claim 14, further comprising forming a third conductive feature in the first dielectric layer, wherein the second dielectric layer and the third dielectric layer extends along sidewalls of the first conductive feature.

19. The method of claim 14, wherein the second conductive feature contacts an upper surface of the first conductive feature.

20. The method of claim 1, wherein a portion of the second dielectric layer extends between the second metal feature and the first dielectric layer.

* * * * *